(12) United States Patent
Koscielniak et al.

(10) Patent No.: US 6,534,759 B1
(45) Date of Patent: Mar. 18, 2003

(54) VERTICAL PHOTODETECTOR WITH IMPROVED PHOTOCARRIER SEPARATION AND LOW CAPACITANCE

(75) Inventors: Waclaw C. Koscielniak, Santa Clara, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/950,121

(22) Filed: Sep. 10, 2001

(51) Int. Cl.[7] .............................................. H01L 31/00
(52) U.S. Cl. ..................... 250/214.1; 250/226; 257/440
(58) Field of Search ........................... 250/226, 214.1, 250/208.1; 257/440; 358/513, 514; 348/272–277; 430/57.2, 57.7, 57.4, 46

(56) References Cited

U.S. PATENT DOCUMENTS

| | | | | |
|---|---|---|---|---|
| 4,656,109 A | * | 4/1987 | Ueno | 356/434 |
| 4,816,889 A | * | 3/1989 | Matsumoto | 257/446 |
| 5,118,636 A | * | 6/1992 | Hosaka | 438/421 |
| 5,747,840 A | | 5/1998 | Merrill | 257/233 |
| 5,801,373 A | * | 9/1998 | Oozu et al. | 250/208.1 |
| 5,965,875 A | | 10/1999 | Merrill | 250/226 |
| 6,133,615 A | * | 10/2000 | Guckel et al. | 257/292 |
| 6,232,626 B1 | * | 5/2001 | Rhodes | 257/291 |
| 6,352,876 B1 | * | 3/2002 | Bordogna et al. | 438/69 |
| 2002/0135034 A1 | * | 9/2002 | Shigenaka et al. | 257/440 |

* cited by examiner

Primary Examiner—David Porta
Assistant Examiner—Stephen Yam
(74) Attorney, Agent, or Firm—Stallman & Pollock LLP (57) ABSTRACT

A vertical photodetector for detecting different wavelengths of light. The structure provides doped regions, which are separated by barrier regions. The doped regions detect photons corresponding to different wavelengths of light. Specifically, by detecting the amount of electrical charge collected by diodes positioned in the different doped regions, different wavelengths of light can be detected. The barrier regions inhibit the flow of electrical charges from one doped region into another doped region. The area of the doped regions can be increased, without increasing the capacitance of the diodes which are used to detect the electrical charges generated by light incident of the vertical photodetector.

17 Claims, 8 Drawing Sheets

VERTICAL PHOTODETECTOR WITH IMPROVED PHOTOCARRIER SEPARATION AND LOW CAPACITANCE

TECHNICAL FIELD

The invention relates to the field of color imaging and color separation in an active pixel array.

BACKGROUND OF THE INVENTION

The use of multiple photodiodes positioned at different depths in a silicon material to operate as color sensors is well known in the art. For example, U.S. Pat. No. 5,965,875 ("the '875 Patent") discloses a "triple well" structure which comprises three photodiodes positioned at different depths in a material. The '875 Patent is incorporated herein by reference. As shown in the '875 patent, one photodiode is positioned at a depth of approximately two microns below the surface of the material. At this depth range, the photodiode corresponds to detection of red photons. Another photodiode which corresponds to the detection of green photons is positioned at a depth of approximately 0.6 $\mu$m below the surface of the material. Positioned above the green photodiode is a blue photodiode.

In the structure disclosed in the '875 patent, if one desires to increase the sensitivity of the color detection structure, then the likely approach is to increase the size of the pixel by increasing the doping regions of the diodes. This approach, however, leads to an increase in the capacitance across the junctions in the photodiodes. As the capacitance increases, some of the benefits of increasing the overall area pixel are lost. This is because the amount of charge accumulated in the photodiode is proportional to the capacitance times the voltage. The voltage is equal to the total electrical charge divided by the capacitance. The charge will increase as the area is increased, but at the same time the area of the p/n junction of the diode is increasing. Thus, the capacitance across the p/n junction is also increasing, so the voltage will tend to remain constant even though the overall area of the pixel is being increased. Thus, it can be difficult to increase the sensitivity of the device.

What is needed is photodetector structure which allows for the sensitivity of a photodetector to be increased, by varying the area where the photons are detected without increasing the capacitance in the photodiodes and thereby losing much of the benefit of increasing the detection area.

SUMMARY

The present invention is directed to a color-sensing device that provides photocarrier separation and low photodiode capacitance. The method for making the color sensing device starts with forming a silicon structure on a substrate. The silicon structure includes a first region, a second region, and a third region. A barrier region separates the first region from the second region, and another barrier region separates the second region from the third region. A first trench is etched into the structure, such that the bottom of the trench is positioned in the first region, and a second trench is etched into the structure such that the bottom of the second trench is positioned in the second region. In each the three regions a photodiode is formed which detects electrical charges excited by the photons of light with differing wavelengths.

One embodiment of the invention provides a structure which has three regions of the of the same conductivity type. Each of the three regions is separated by a barrier region, which serves to inhibit the flow of electrons between the regions. In one embodiment, the invention includes a silicon structure with a first region in the silicon doped with P– dopant, wherein the first region is disposed in a first depth range in the silicon which corresponds to a depth red light penetrates into the silicon. The structure also includes a second region in the silicon doped with P– dopant, wherein the second region is disposed in a second depth range in the silicon which corresponds to a depth that green light penetrates into the silicon; and a third region in the silicon doped with P– dopant, wherein the third region is disposed in a third depth range in the silicon which corresponds to a depth that blue light penetrates into the silicon. A first trench is formed in the silicon, such that a bottom of the first trench is disposed in the first region. A second trench formed in the silicon, such that a bottom of the second trench is disposed in the second region. A third trench formed in the silicon, such that a bottom of the third trench is disposed in the third region. Adjacent to the bottom of each of the trenches are regions containing N+ dopant which are disposed in the first, second and third regions. The junctions between the silicon regions containing N+ dopant and the P– dopant form photodiodes.

These and other features, aspects and advantages of the present invention will become better understood with reference to the following description and the appended claims.

DETAILED DESCRIPTION

Figure 1:
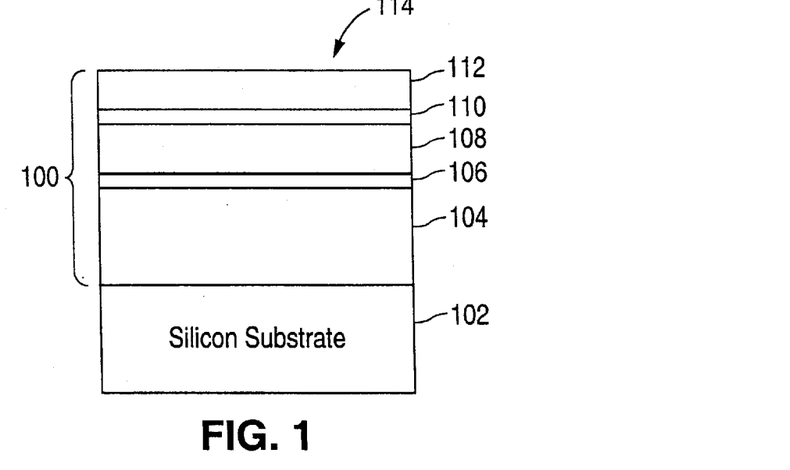
FIG. 1 is a cross sectional view of a silicon structure formed on a silicon substrate.

FIG. 1 shows a silicon substrate 102 on which a color-sensing device is formed. The color-sensing device includes a silicon structure 100 which is formed on the substrate 102. The silicon structure 100 includes a first region 104 and above the first region is a barrier region 106. Above the barrier region 106 is a second region 108 which is of a conductivity-type identical to that of region 104. Above the second region 108 is a second barrier region 110 and above this region is a third region which has the same conductivity-type as the first region 104 and the second region 108.

Figure 2:
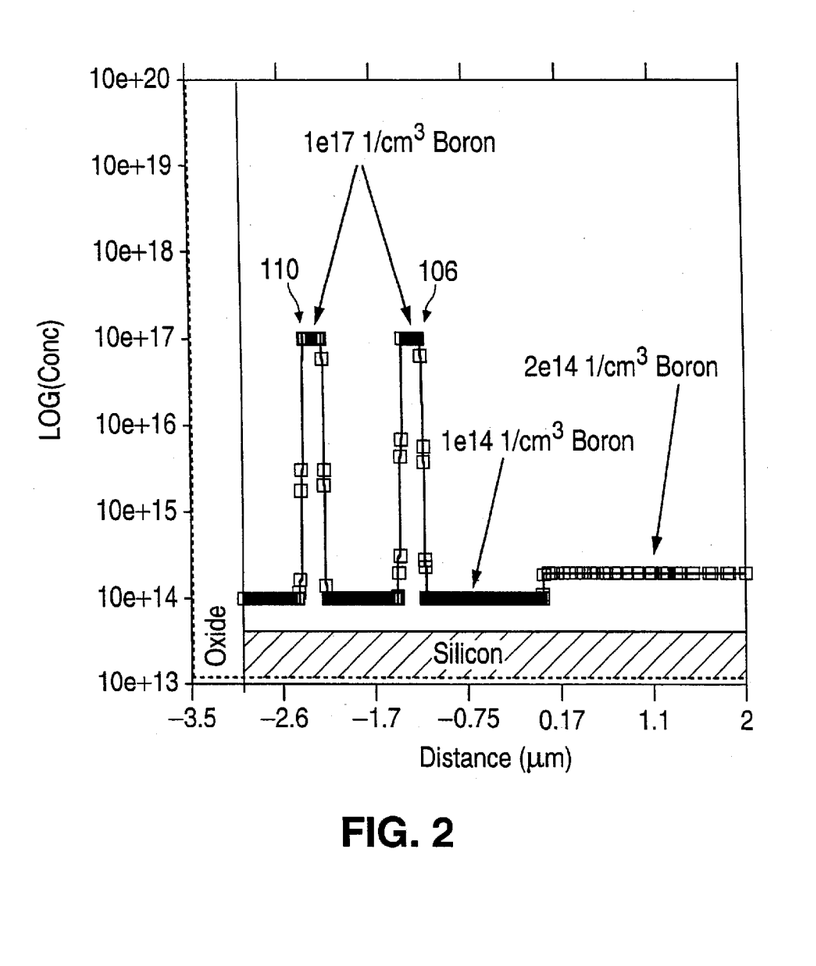
FIG. 2 is a doping profile for the silicon structure and silicon substrate shown in FIG. 1.

In one embodiment, the silicon structure 100 is formed using epitaxial modulation. Specifically, the different regions of the silicon material 100 can be formed using epitaxial modulation doping techniques which are well known in the art. FIG. 2 shows the doping profile for the structure shown in FIG. 1. The region from 0 to 2 $\mu$m corresponds to the silicon substrate 102 which is doped with Boron and has a density in the range of 2e14 l/cm$^3$. The region from approximately 0 to −1.3 $\mu$m corresponds to region 104 which is doped with Boron and has a dopant density in the range of 1e14 l/cm$^3$. The region from approximately −1.3 to −1.5 $\mu$m corresponds to the barrier region 106 which is doped with Boron and has a dopant density in the range of 1e17 l/cm$^3$. The region from approximately −1.5 to −2.3 $\mu$m corresponds to region 108 which is doped with Boron and has a density in the range of 1e14 l/cm$^3$. The region from approximately −2.3 to −2.5 $\mu$m corresponds to the barrier region 110 and is doped with Boron with a dopant density of 1e17 l/cm$^3$. The region from approximately −2.5 to −3 $\mu$m corresponds to region 112 and is doped with Boron to have a dopant ion density of 1e14 l/cm$^3$.

As a result of the above-described doping, all of the regions of the silicon material are of P− conductivity type. The barrier regions 106 and 110 are, however, much more heavily doped than the regions 104, 108 and 112, and as a result, the barrier regions 106 and 110 serve to inhibit the flow of electrons between regions 104, 108 and 112.

As is known in the art the different conductivity types and different levels of doping concentration can be created in an epitaxially formed silicon material by using different gasses during the epitaxial process of growing the silicon structure 100, or by varying the concentration of gasses during the process. During the epitaxial process used to form the structure 100, the silicon material is exposed to a gas containing Boron. The concentration of the gas is significantly increased during the formation of the barrier regions 106 and 110.

It should be noted that the structure described herein could also be produced using ion implantation techniques. Specifically, ion implantation could be used to create the first barrier region 106, the second barrier region 110, and regions 104, 108, and 112. It is believed, however, that use of ion implantation techniques may be more difficult than using an epitaxial modulation process to form the color sensing device.

Figure 3:
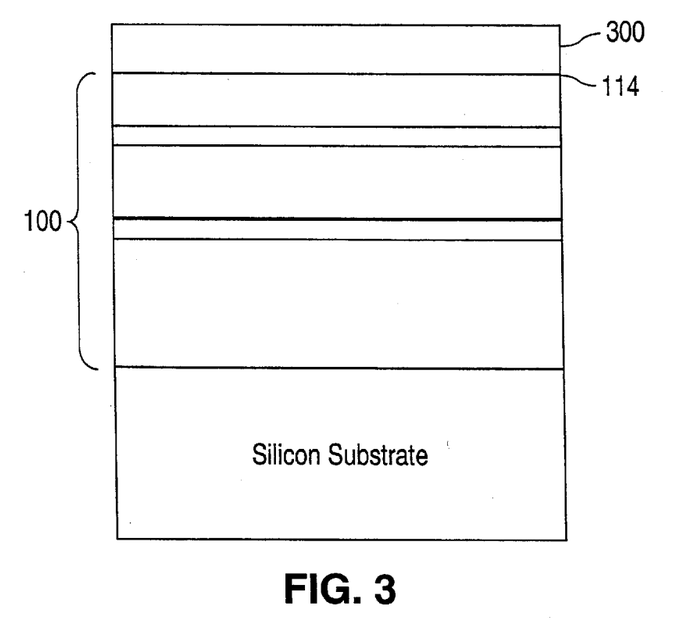
FIG. 3 shows an oxide layer formed on the silicon structure of FIG. 1.

Once the structure shown in FIG. 1 has been formed, the next step is to etch trenches into the silicon structure 100. In one embodiment, this is done using a three-step process to form three trenches of different depths in the silicon structure 100. FIG. 3 shows a trench oxide layer 300 formed on the surface 114 of the silicon structure 100. The trench oxide layer 300 is formed in two steps. First a thin layer of thermal oxide is grown on the surface 114 of the silicon structure 100. The use of thermal oxide helps to ensure a good interface between the oxide and the surface 114 of the silicon structure 100. After the thin thermal oxide layer has been formed, a thicker layer of oxide is deposited on the thermal oxide layer using a chemical vapor deposition (CVD) process.

Figure 4:
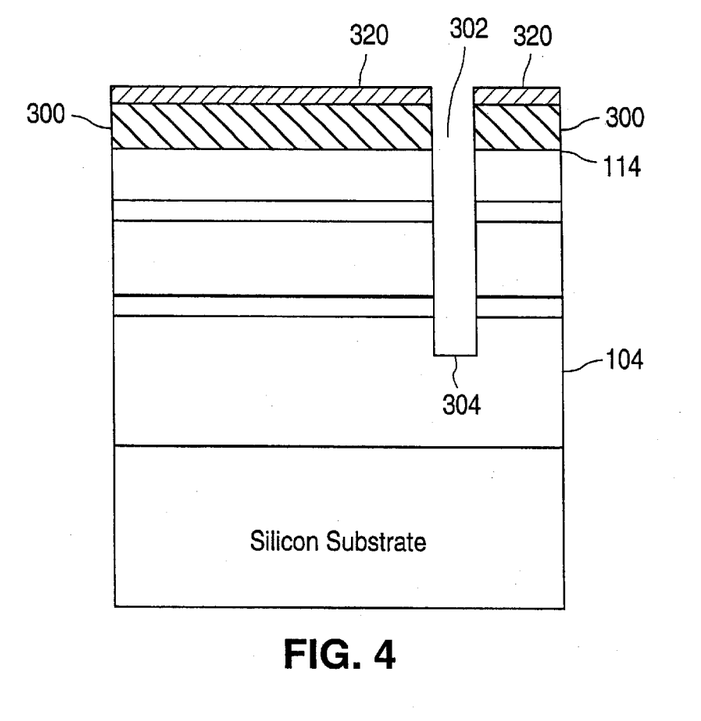
FIG. 4 shows the cross sectional view of FIG. 1 with a trench etched into the silicon structure.

After the trench oxide layer 300 has been formed a photoresist mask 320 is formed on the trench oxide using standard photolithographic techniques. The mask 320 defines an area to be etched. At this point, an anisotropic etching process is used to etch a trench 302 as shown in FIG. 4. This trench is etched to a depth such that the bottom of the trench 304 is positioned in the region 104 of the silicon structure 100. After the trench 302 has been etched the photoresist mask 320 is stripped.

Figure 5:
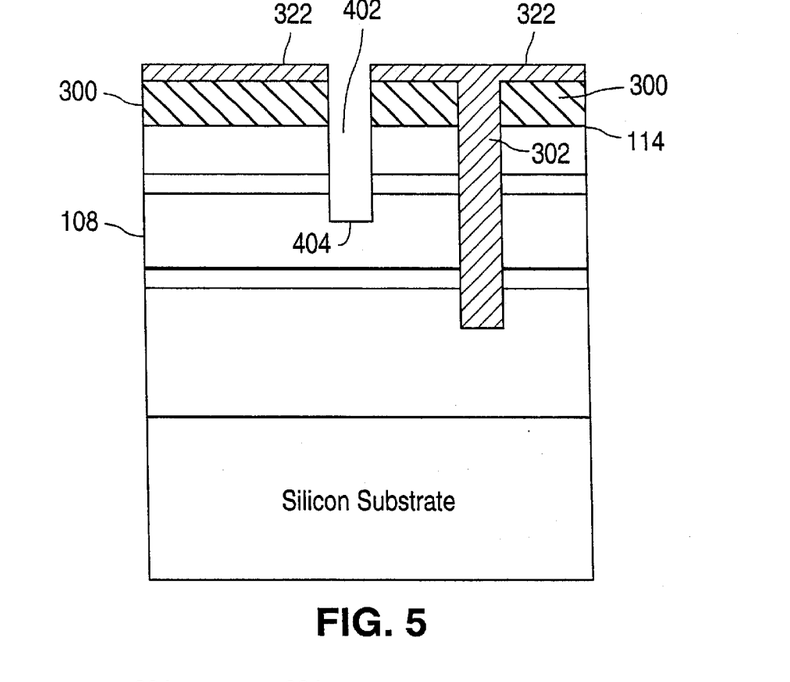
FIG. 5 shows the cross sectional view of FIG. 1 with a second trench etched into the silicon structure.

As shown in FIG. 5, after the mask 320 is stripped another photoresist mask 322 is formed on the trench oxide 300. This mask 322 also covers the first trench 302. At this point another etching process is commenced and a second trench 402 is formed. The second trench 402 is formed in the silicon structure 100 such that the bottom of the trench 404 is positioned in the second region 108.

Figure 6:
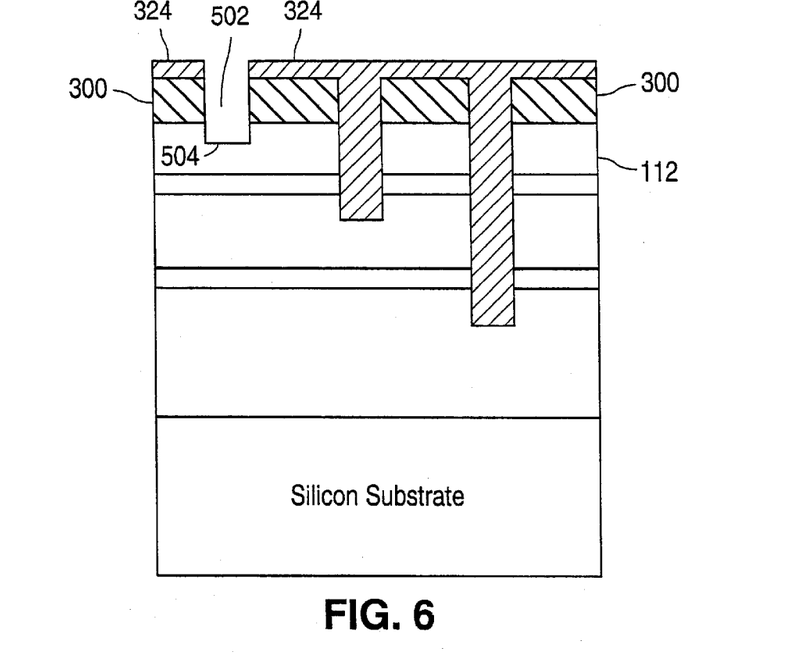
FIG. 6 shows the cross sectional view of FIG. 1 with a third trench etched into the structure.

As shown in FIG. 6, after the trench 402 is formed, another photoresist mask 324 is formed on the trench oxide layer after the mask 322 as been stripped. The mask 324 also covers the trenches 302 and 402. At this point the anisotropic etching technique is again used to create a third trench 502. The third trench is formed in the silicon structure 100 such that the bottom of the trench 504 is positioned in the third region 112. After the trench 502 has been formed the mask 324 is stripped. The trench 502 that is etched into the third region 112 is optional. As will be discussed in more detail below, the trenches are used to make contact with photodiodes which are formed in the regions 104, 108 and 112. Because region 112 is the top region of the structure 100, a photodiode formed in this region could be formed very close to the surface and contact could be made without creating a trench.

Figure 7:
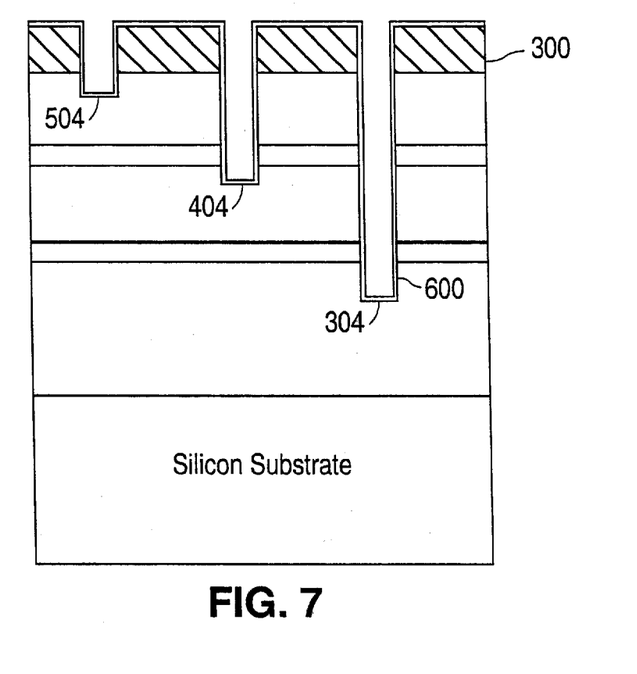
FIG. 7 shows the cross sectional view of FIG. 6 with an oxide liner formed in the three trenches.

As shown in FIG. 7, a liner oxide 600 is then formed on the sidewalls and bottom of the trenches 302, 402 and 502. The liner oxide is a thermal oxide to provide a good interface between the silicon structure 100 and the oxide 600. A very thin layer of this thermal oxide may also form on the trench oxide 300. For most purposes, the amount of liner oxide 600 formed over the trench oxide 300 is negligible. The liner oxide material 600 is used to provide insulation for contacts which will be disposed in the trenches. After the liner oxide layer 600 has been formed, an anisotropic oxide etch is used to open bottoms of trenches 304, 404, and 504. This is done by forming a photoresist mask is formed over the surface liner oxide layer 600. This mask is such that the bottoms 504, 404, and 304 of the trenches 502, 402 and 302 are left exposed.

Figure 8:
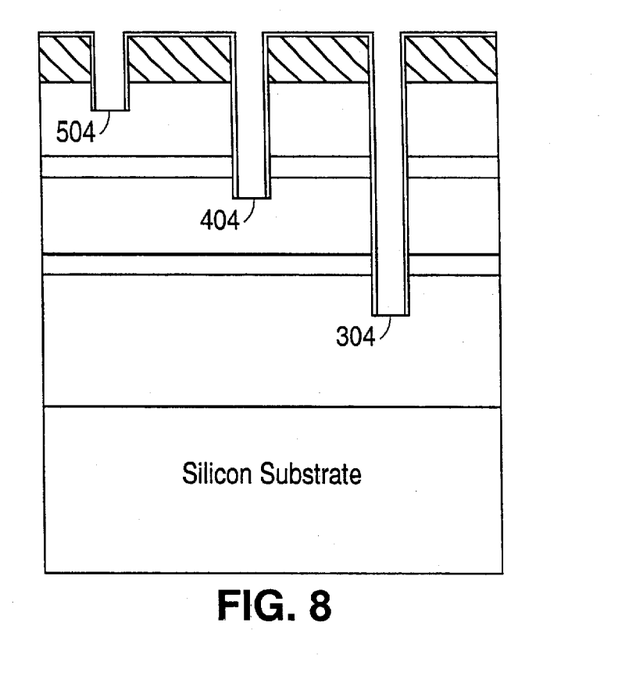
FIG. 8 shows a cross sectional view of the silicon structure with a portion of the oxide liner removed from the trenches.
Figure 9:
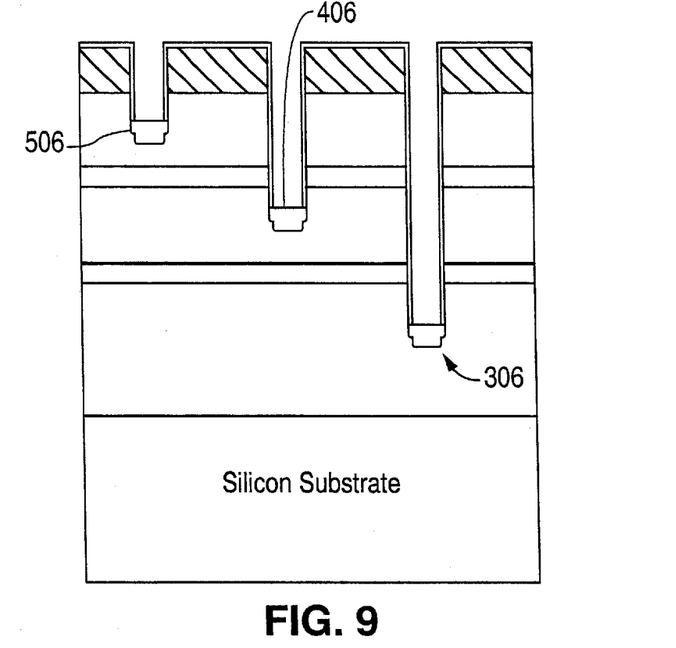
FIG. 9 shows a cross sectional view of the structure after dopant has been implanted through the bottom of the trenches.

At this point, the next step is to use an anisotropic etching process to remove the liner oxide 600 covering the bottoms 304, 404, and 504 of the trenches 302, 402 and 502, as shown in FIG. 8. After the liner oxide has been removed from the bottom of the trenches the next step is to dispose N+ dopant in the regions 104, 108 and 112, adjacent to the bottoms 304, 404 and 504 of the trenches 302, 402 and 502. Dopant can be disposed in these areas in a number of ways. One option is to use a zero-degree ion implantation technique, as shown in FIG. 9. This process consists of implanting N+ dopant vertically through the bottoms 304, 404, and 504 of the trenches 302, 402 and 502. The ion implantation results in N+ type dopant regions 306, 406 and 506 disposed under the bottoms of the trenches.

Figure 10:
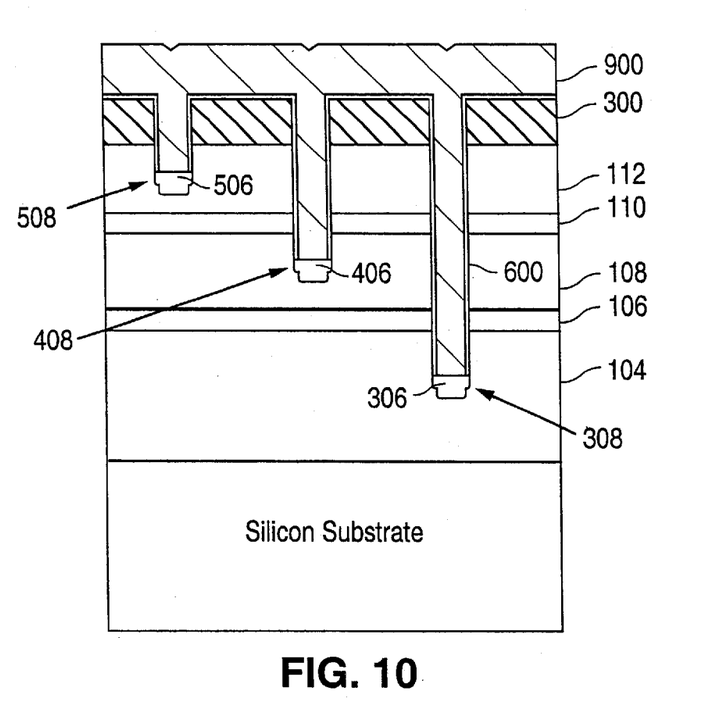
FIG. 10 shows a cross sectional view of the structure after doped polysilicon has been formed in the trenches, and dopant has been diffused from the doped polysilicon into the silicon structure.

Another option, which is the presently preferred approach, is to use a CVD process to deposit polysilicon 900 in the trenches 302, 402 and 502 as shown in FIG. 10. In conjunction with this process an in-situ doping method is employed. Specifically, the polysilicon layer 900 is formed so that it is doped with (arsenic) "As" with a concentration in the range of 1e20 l/cm$^3$. It should be noted that other elements could also be used, such as phosphorus. This doped layer of polysilicon 900 is formed by injecting AsH$_3$ and SiH$_4$ during the CVD process. After the deposition, thermal annealing is used to diffuse As from polysilicon 900 into the P–regions 104, 108 and 112, thereby forming the N+regions 306, 406 and 506, as shown in FIG. 10. The resulting N+/P– junctions are photodiodes 308, 408 and 508 which collect photocarriers (i.e., electrons and holes generated by light penetrating into the P– regions 104, 108 and 112). The use of N+/P– dopants to dope silicon and form photodiodes is well known in the art.

The region 104 begins at a depth of approximately 1.7 $\mu$m below the top surface of the material and continues down into the substrate. The region 108 begins at a depth of approximately 0.7 $\mu$m below the surface of the material and extends to a depth of approximately 1.5 $\mu$m below the surface 114 of the silicon structure 100. The region 112 corresponds to a depth of zero to approximately 0.3 $\mu$m below the surface 114 of the material 110. The depth of region 104 corresponds to the depth which light in the red spectrum would penetrate into the depths of the material. Red light will provide energy for the generation of electrical charges in silicon up to the depth corresponding to the red region. These charges will be accumulated by the photodiode 308. Similarly, light in the green region of the color spectrum will penetrate into the second region of the material and excite electrical charges in this region which will be collected by the photodetector 408. Finally, light in the blue region of the color spectrum will excite electrical charges in the region 112 which will be collected by the photodetection diode 508.

As previously discussed the barrier regions 106 and 110 have a high concentrations of P– dopant. These regions operate to prevent electrical charges of the photodetection regions 104, 108, and 112 from migrating between regions. For example, if the color sensing device were exposed to red light, the photons of red light would penetrate to the region 104 and excite electrons which would result in an electrical charge collecting at photodiode 308. The excited electrons would not, however, be able to cross the barrier region 106, and thus the red light would not result in an electrical charge being collected at photodiode 408.

Figure 11:
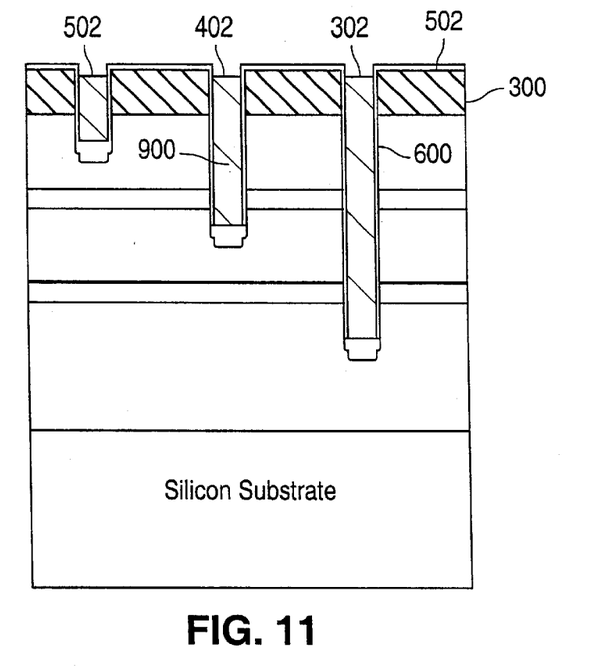
FIG. 11 shows a cross sectional view of the structure after a portion of the doped polysilicon has been removed from the top surface of the oxide formed over the silicon structure.

As shown in FIG. 11, after the polysilicon layer 900 is formed, it is etched back, such that it is removed from the top surface 502 of the trench oxide layer 300. This polysilicon material over the surface of the liner oxide can be removed using standard etching techniques. The polysilicon material 900 that remains in the trenches 302, 402 and 502 serve as contacts for the photodiodes 308, 408 and 508.

Figure 12:
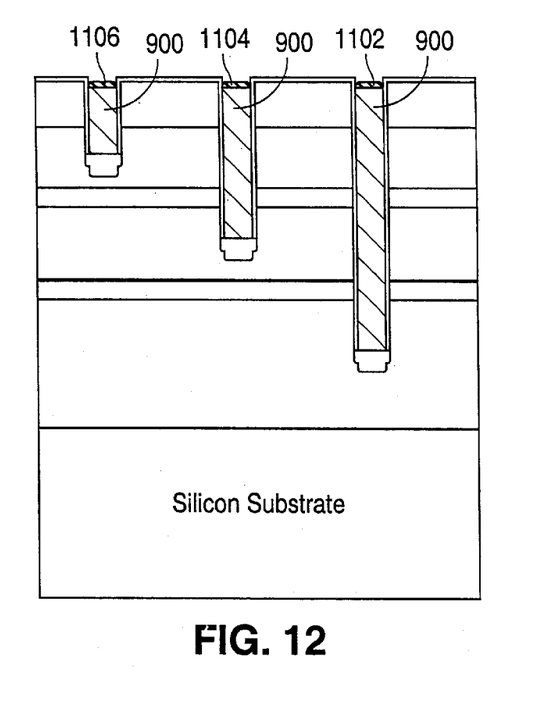
FIG. 12 shows a cross sectional view after $TiSi_2$ pads have been formed above the doped polysilicon in the trenches.

FIG. 12 shows the step of TiSi$_2$ silicidation. In this step TiSi$_2$ pads 1102, 1104 and 1106 are formed over conductive material 900 that resides in each of the trenches 302, 402, and 502. The process of TiSi$_2$ silicidation is well known in the art, and is used to provide an improved contact between the polysilicon 900 and electrodes 1202, 1204 and 1206.

Figure 13:
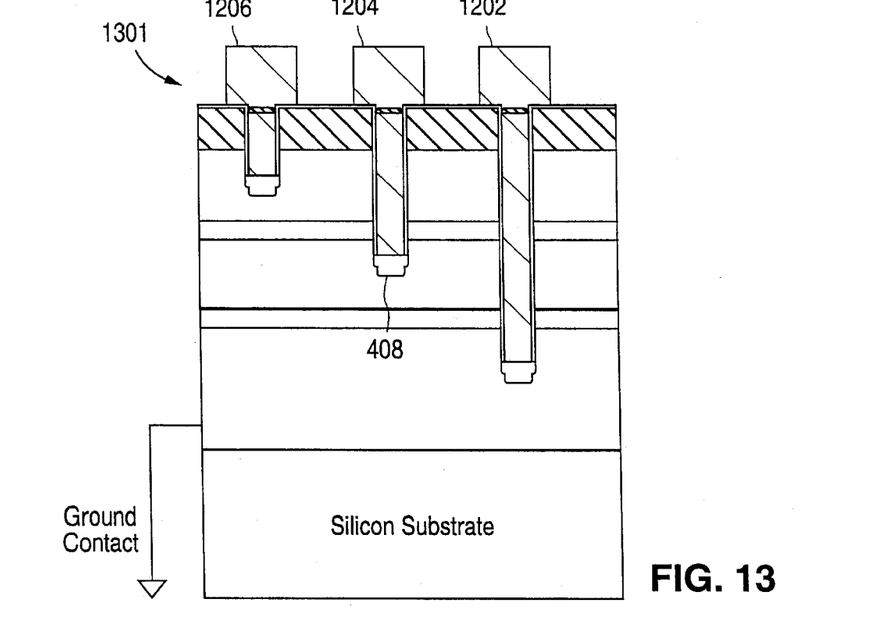
FIG. 13 shows a cross sectional view after electrodes have been formed above the polysilicon in the trenches.

FIG. 13 shows the formation of the electrodes 1202, 1204, and 1206 over the above the TiSi$_2$ pads 1102, 1104 and 1106. In one embodiment these electrodes would all be connected to circuitry designed to read the current generated by the photodiodes when they are exposed to light.

Figure 14:
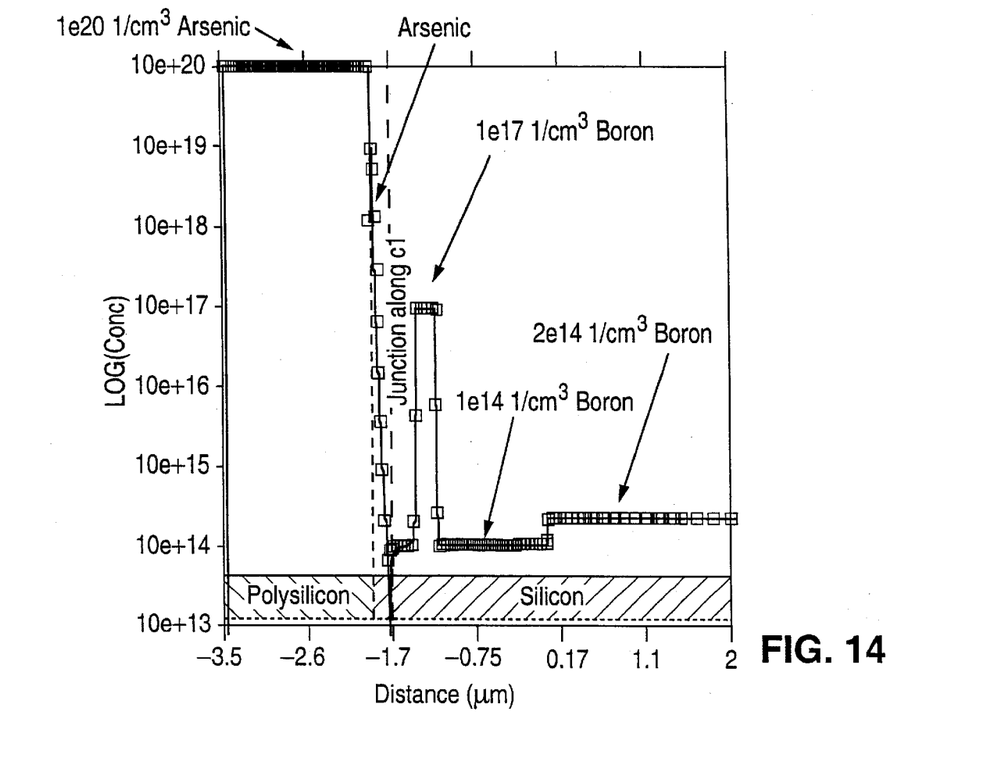
FIG. 14 shows the doping profile for a cross section of the structure taken through the middle trench of the structure.

FIG. 14 shows the doping profile for a cross section of the vertical photodetector 1301 at the point of the photodiode 408. The region ranging from approximately −3.5 $\mu$m to −2 $\mu$m corresponds to the polysilicon 900 disposed in trench 402. As shown in FIG. 14 the doped polysilicon has a concentration of As in the range of 1e20 l/cm$^3$. The region ranging from approximately −2 $\mu$m to −1.7 $\mu$m corresponds to the N+ region 406 diffused into the P– region 108. This area has concentrations of diffused As in the range of 1e19 l/cm$^3$.

Figure 15:
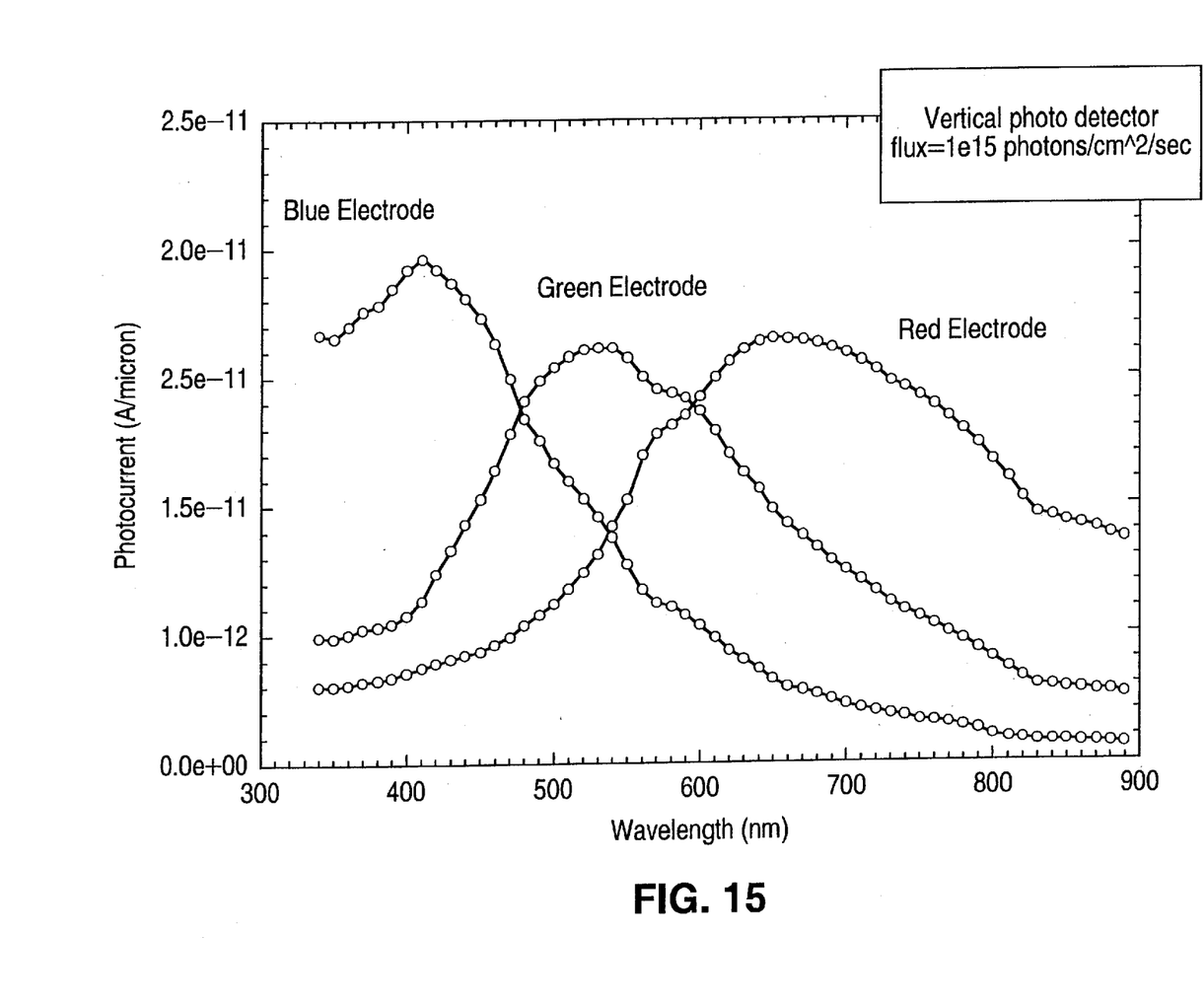
FIG. 15 shows the spectral response for the vertical photodetector shown in FIG. 13.

FIG. 15 shows the vertical photodetector spectral response graph to different wavelengths of light. Specifically, the graph shows the current generated by each of the three photodiodes in response to light in the 300–900 nm spectral wavelength range. As shown, blue light having a wavelength of approximately 400 nanometers generates a large amount of current from the blue photodiode 508, and correspondingly lower currents from the green photodiode 408 and the red photodiode 308. Light in the green range of the spectrum having a wavelength of approximately 530 nanometers generates a large current in the green photodiode 408 and correspondingly lower currents in the red photodiode 308 and blue photodiode 508. And finally, light in the red range of the spectrum approximately 660 nanometers generates a large current in the red photodiode 308 and correspondingly smaller currents in the blue and green photodiodes 508 and 408 respectively.

One of the advantages of the structure of the vertical photodetector 1301 is that the surface areas of the P– regions can be varied to change the sensitivity of the photodetector. As the surface area of the P– region is increased incident light will cause the excitation of a greater number of electrons and holes which will be detected at the photodiode. The area of the N+/P– junction of the photodiode does not need to be increased in proportion to the increase in the surface area of the P– region. Thus, the capacitance of the photodiode can be held relatively constant, and increases in sensitivity can be achieved by increasing the surface areas of regions 104, 108 and 112. It should also be noted any number of P– regions can be created, and each P– region can be separated by a barrier region. Photodiodes can then be formed in each of the P– regions. The depth regions of the P– regions can be varied to adapt the vertical photodetector so that it has different characteristics. For more precise color light detection, more than three photodiodes could be used. For example, a vertical photodetector could be created that can distinguish between subtle differences in light color.

It will be recognized by one skilled in the art that the type of circuitry needed to read the currents output by these photodetectors is easily developed using known techniques.

While the method and apparatus of the present invention has been described in terms of its presently preferred and alternate embodiments, those skilled in the art will recognize that the present invention may be practiced with modification and alteration within the spirit and scope of the appended claims. The specifications and drawings are, accordingly, to be regarded in an illustrative rather than a restrictive sense. Further, even though only certain embodiments have been described in detail, those having ordinary skill in the art will certainly understand that many modifications are possible without departing from the teachings thereof. All such modifications are intended to be encompassed within the following claims.

What is claimed is:

1. A method of forming a color sensing device, said method comprising:

forming a silicon structure on a substrate such that the silicon structure includes a first region at a first depth range, a second region at a second depth range wherein the second depth range is different than the first depth range, a third region at a third depth range wherein the third depth range is different than the first depth range and the second depth range, a first barrier region separating the first region and the second region, and a second barrier region separating the second region from the third region;

etching a first trench having sidewalls and a bottom such that the bottom of the first trench is positioned in the first region;

etching a second trench having sidewalls and a bottom such that the bottom of the second trench is positioned in the second region;

forming a first photodiode adjacent to the bottom of the first trench;

forming a second photodiode adjacent to the bottom of the second trench, and forming a third photodiode in the third region.

2. The method of claim 1 wherein the step of forming the color sensing device further comprises:

epitaxially growing the silicon structure; and doping the silicon structure to create the first region, the first barrier region, the second region, the second barrier region, and the third region, wherein the first region, the second region, and the third region are doped to have a first dopant density, and the first barrier region and the second barrier region are of a second dopant density such that the first barrier region serves to inhibit the movement of electrons between the first region and the second region, and the second barrier region serves to inhibit the movement of electrical charges between the second region and the third region.

3. The method of claim 1 wherein the forming of a first photodiode comprises implanting dopant through the bottom of the first trench.

4. The method of claim 3 wherein the forming of a second photodiode comprises implanting dopant through the bottom of the second trench.

5. The method of claim 1 wherein the etching the first trench further comprises:

forming a first oxide layer on the surface of the silicon material;

forming a first photoresist mask above the first oxide layer; and etching the first trench to a depth such that the bottom of the trench is positioned in the first region.

6. The method of claim 5 wherein the etching the second trench further comprises:

removing the first photoresist mask from above the first oxide layer; forming a second photoresist mask above the first oxide layer; and etching the second trench to a depth such that the bottom of the trench is positioned in the second region.

7. The method of claim 1 wherein the forming of a first photodiode comprises:

forming a doped polysilicon material in the first trench; and diffusing dopant from the doped polysilicon into the first region.

8. The method of claim 7 wherein the forming of a second photodiode comprises:

forming a doped polysilicon material in the second trench; and diffusing dopant from the doped polysilicon into the second region.

9. The method of claim 8 wherein P− dopant is used during the doping of the silicon structure to create the first region and the second region, and wherein N+ dopant is diffused from the doped polysilicon in the first region and the second region.

10. A color sensing structure formed in silicon for detecting light of different wavelengths, the color sensing structure comprising:

a first doped region of a first conductivity type formed in a first depth range in the silicon;

a second doped region of the first conductivity type formed in a second depth range in the silicon;

a first barrier region formed between the first doped region and the second doped region;

a third doped region of the first conductivity type formed in a third depth range in the silicon; and a second barrier region formed between the second doped region and the third doped region;

a first trench having a bottom disposed in the silicon material, wherein the first trench bottom is disposed in the first doped region;

a second trench having a bottom disposed in the silicon material, wherein the second trench bottom is disposed in the second doped region;

a fourth doped region of a second conductivity type disposed in the first region adjacent to the bottom of the first trench, such that a junction between the first doped region and the fourth doped region forms a first photodiode;

a fifth doped region of a third conductivity type disposed in the second region adjacent to the bottom of the second trench, such that a junction between the second doped region and the fifth doped region forms a second photodiode; and a sixth doped region of the second conductivity type disposed in the third region, such that a junction between the third doped region and the sixth doped region forms a third photodiode.

11. The color sensing structure of claim 10 wherein the first conductivity type is P− conductivity, and the second conductivity type is N+ conductivity.

12. The color sensing structure of claim 10 wherein the first depth range corresponds to the depth which red light penetrates into the silicon material, the second depth range corresponds to the depth which green light penetrates into the silicon material, and the third depth range corresponds to the depth which blue light penetrates into the silicon material.

13. A color sensing structure formed in epitaxially grown silicon for detecting light of different wavelengths, the color sensing structure comprising:

a first region in the silicon doped with P− dopant, wherein the first region is disposed in a first depth range in the silicon which corresponds to a depth red light penetrates into the silicon;

a second region in the silicon doped with P− dopant, wherein the second region is disposed in a second depth range in the silicon which corresponds to a depth that green light penetrates into the silicon;

a third region in the silicon doped with P− dopant, wherein the third region is disposed in a third depth range in the silicon which corresponds to a depth that blue light penetrates into the silicon;

a first trench formed in the silicon, such that a bottom of the first trench is disposed in the first region;

a second trench formed in the silicon, such that a bottom of the second trench is disposed in the second region;

a third trench formed in the silicon, such that a bottom of the third trench is disposed in the third region;

a fourth region disposed in the first region adjacent the bottom of the first trench containing N+ dopant, wherein a junction between P− dopant of the first region, and N+ dopant of the fourth region, form a photodiode;

a fifth region disposed in the second region adjacent the bottom of the second trench containing N+ dopant, wherein a junction between P− dopant of the second region, and N+ dopant of the fifth region, form a photodiode; and a sixth region disposed in the third region adjacent the bottom of the third trench containing N+ dopant, wherein a junction between P− dopant of the third region, and N+ dopant of the sixth region, form a photodiode.

14. The color sensing structure of claim 13 further comprising:

a first barrier region disposed between the first region and the second region; and a second barrier region disposed between the second region and the third region.

15. A method of forming a color sensing device, said method comprising:

forming a silicon structure on a substrate such that the silicon structure includes a first region at a first depth range, a second region at a second depth range, a third region at a third depth range, a first barrier region separating the first region and the second region, and a second barrier region separating the second region from the third region;

etching a first trench having sidewalls and a bottom such that the bottom of the first trench is positioned in the first region;

etching a second trench having sidewalls and a bottom such that the bottom of the second trench is positioned in the second region;

forming a first photodiode adjacent to the bottom of the first trench;

forming a second photodiode adjacent to the bottom of the second trench;

forming a third photodiode in the third region;

forming a doped polysilicon material in the first trench; and diffusing dopant from the doped polysilicon into the first region.

16. The method of claim 15 wherein the forming of a second photodiode comprises:

forming a doped polysilicon material in the second trench; and diffusing dopant from the doped polysilicon into the second region.

17. The method of claim 16 wherein P− dopant is used during the doping of the silicon structure to create the first region and the second region, and wherein N+ dopant is diffused from the doped polysilicon in the first region and the second region.

* * * * *